United States Patent
Paek et al.

(10) Patent No.: US 10,535,620 B2
(45) Date of Patent: Jan. 14, 2020

(54) SEMICONDUCTOR PACKAGE AND MANUFACTURING METHOD THEREOF

(71) Applicant: Amkor Technology, Inc., Tempe, AZ (US)

(72) Inventors: Jong Sik Paek, Incheon (KR); No Sun Park, Gwangju-si (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/936,877

(22) Filed: Mar. 27, 2018

(65) Prior Publication Data

US 2018/0240768 A1  Aug. 23, 2018

Related U.S. Application Data

(63) Continuation of application No. 15/289,738, filed on Oct. 10, 2016, now Pat. No. 9,929,113, which is a
(Continued)

(30) Foreign Application Priority Data

Dec. 3, 2014 (KR) .................. 10-2014-0172090

(51) Int. Cl.
*H01L 23/00* (2006.01)
*H01L 25/065* (2006.01)

(52) U.S. Cl.
CPC .............. *H01L 24/05* (2013.01); *H01L 24/13* (2013.01); *H01L 24/24* (2013.01); *H01L 24/25* (2013.01);
(Continued)

(58) Field of Classification Search
CPC ......... H01L 24/73; H01L 24/24; H01L 24/08; H01L 24/13; H01L 25/0657; H01L 24/05; H01L 2224/2101; H01L 24/82; H01L 2224/1412; H01L 2224/02372; H01L 2224/02371; H01L 2224/05548; H01L 2224/05008; H01L 23/3114; H01L 2224/82; H01L 2224/92244; H01L 2224/32145; H01L 2224/022;
(Continued)

(56) References Cited

U.S. PATENT DOCUMENTS 6,836,025 B2   12/2004   Fujisawa et al.
7,208,825 B2    4/2007   Pu
(Continued)

FOREIGN PATENT DOCUMENTS

KR        10-0784388 B1     12/2007
KR     10-2013-0018090 A1    2/2013

OTHER PUBLICATIONS

Korean Office Action dated Mar. 3, 2016 for Korean Patent Application No. 10-2014-0172090.

*Primary Examiner* — Jasmine J Clark
(74) *Attorney, Agent, or Firm* — McAndrews, Held & Malloy, Ltd.

(57) ABSTRACT

A semiconductor device structure and a method for manufacturing a semiconductor device. As a non-limiting example, various aspects of this disclosure provide a semiconductor device structure (e.g., a sensor device structure), and method for manufacturing thereof, that comprises a three-dimensional package structure free of wire bonds, through silicon vias, and/or flip-chip bonding.

20 Claims, 6 Drawing Sheets

Related U.S. Application Data continuation of application No. 14/815,435, filed on Jul. 31, 2015, now Pat. No. 9,466,580.

(52) U.S. Cl.
CPC .............. *H01L 24/73* (2013.01); *H01L 24/82* (2013.01); *H01L 25/0657* (2013.01); *H01L 2224/022* (2013.01); *H01L 2224/02371* (2013.01); *H01L 2224/02375* (2013.01); *H01L 2224/0401* (2013.01); *H01L 2224/04105* (2013.01); *H01L 2224/05024* (2013.01); *H01L 2224/05569* (2013.01); *H01L 2224/05572* (2013.01); *H01L 2224/12105* (2013.01); *H01L 2224/13022* (2013.01); *H01L 2224/13023* (2013.01); *H01L 2224/13024* (2013.01); *H01L 2224/14131* (2013.01); *H01L 2224/2499* (2013.01); *H01L 2224/24105* (2013.01); *H01L 2224/24146* (2013.01); *H01L 2224/25175* (2013.01); *H01L 2224/32145* (2013.01); *H01L 2224/73217* (2013.01); *H01L 2224/73267* (2013.01); *H01L 2224/82* (2013.01); *H01L 2224/8203* (2013.01); *H01L 2224/92244* (2013.01); *H01L 2224/94* (2013.01); *H01L 2224/97* (2013.01)

(58) Field of Classification Search
CPC ....... H01L 2224/05024; H01L 2224/83; H01L 2224/94; H01L 2224/8203; H01L 23/481; H01L 23/48; H01L 24/25; H01L 2224/05569; H01L 2224/13022; H01L 2224/25175

See application file for complete search history.

(56) References Cited

U.S. PATENT DOCUMENTS

| | | | |
|---|---|---|---|
| 8,354,747 | B1 | 1/2013 | Kuo |
| 8,710,639 | B2 * | 4/2014 | Kikuchi ............... H01L 21/6835 257/679 |
| 9,466,580 | B2 | 10/2016 | Paek et al. |
| 9,929,113 | B2 | 3/2018 | Paek et al. |
| 2004/0070064 | A1 | 4/2004 | Yamane et al. |
| 2012/0001326 | A1 | 1/2012 | Tay et al. |
| 2012/0312590 | A1 | 12/2012 | Maeda |
| 2016/0163662 | A1 | 6/2016 | Paek et al. |
| 2017/0062364 | A1 | 3/2017 | Paek et al. |

* cited by examiner

SEMICONDUCTOR PACKAGE AND MANUFACTURING METHOD THEREOF

CROSS-REFERENCE TO RELATED APPLICATIONS/INCORPORATION BY REFERENCE

The present application is a continuation of U.S. application Ser. No. 15/289,738, filed Oct. 10, 2016, expected to issue on Mar. 27, 2018 as U.S. Pat. No. 9,929,113, and titled "SEMICONDUCTOR PACKAGE AND MANUFACTURING METHOD THEREOF," which is a continuation of U.S. application Ser. No. 14/815,435, filed Jul. 31, 2015, now U.S. Pat. No. 9,466,580, issued Oct. 11, 2016, and titled "SENSOR PACKAGE AND MANUFACTURING METHOD THEREOF," which makes reference to, claims priority to, and claims the benefit of Korean Patent Application No. 10-2014-0172090, filed on Dec. 3, 2014 in the Korean Intellectual Property Office and titled "SENSOR PACKAGE AND MANUFACTURING METHOD THEREOF," the contents of each of which are hereby incorporated herein by reference, in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present systems, methods and/or architectures for forming semiconductor packages, for example sensor packages, are inadequate. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate examples of the present disclosure and, together with the description, serve to explain various principles of the present disclosure. In the drawings.

SUMMARY

Figure 1A:
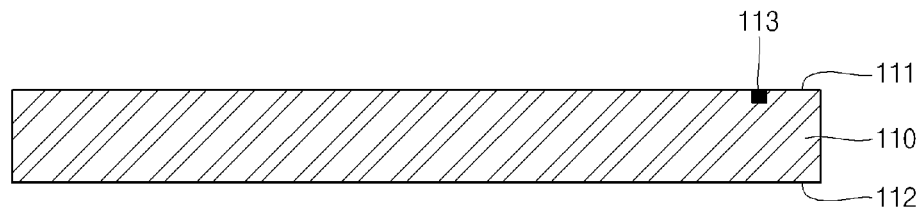
FIGS. 1A-1G are cross-sectional views illustrating an example manufacturing method of a semiconductor device, in accordance with various aspects of the present disclosure.

Various aspects of this disclosure provide a semiconductor device structure and a method for manufacturing a semiconductor device. As a non-limiting example, various aspects of this disclosure provide a semiconductor device structure (e.g., a sensor device structure), and method for manufacturing thereof, that comprises a three-dimensional package structure free of wire bonds, through silicon vias, and/or flip-chip bonding.

DETAILED DESCRIPTION OF VARIOUS ASPECTS OF THE DISCLOSURE

The following discussion presents various aspects of the present disclosure by providing various examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Various aspects of the present disclosure provide a semiconductor device or package (e.g., a sensor package) and a manufacturing method thereof, which can reduce the thickness and/or manufacturing cost of the semiconductor device.

The above and other aspects of the present disclosure will be described in or be apparent from the following description of various example implementations.

According to an aspect of the present disclosure, there is provided a manufacturing method of a semiconductor device (e.g., a sensor package), the manufacturing method comprising preparing a first semiconductor die having a first bond pad, adhering or otherwise mounting a second semiconductor die having a second bond pad to the first semiconductor die, forming a first passivation layer on the first and second semiconductor dies to expose the first and second bond pads to the outside of the first passivation layer, connecting the first and second bond pads to a redistribution layer, and/or connecting one or more conductive attachment structures (e.g., package attachment or connecting structures, etc.) to the redistribution layer.

The first and second bond pads and the connecting structure(s) may, for example, be electrically connected to each other by the redistribution layer.

The redistribution layer may, for example, comprise a first redistribution layer trace connecting the first and second bond pads to each other and a second redistribution layer trace connecting the second bond pad and the connecting structure to each other.

The example manufacturing method may, for example, further comprise forming a second dielectric layer (e.g., a passivation layer, mold layer, etc.) on the redistribution layer, where the connecting structure(s) are exposed to the outside of the second dielectric layer.

The example manufacturing method may, for example, further comprise forming an encapsulant layer on the second dielectric layer, where the connecting structure(s) are exposed to the outside of the encapsulant layer.

A width of the first semiconductor die may, for example, be greater than a width of the second semiconductor die.

Under bump metals may, for example, be formed between the connecting structure(s) and the redistribution layer. For example, an underbump metallization ("UBM") structure may comprise a layer of titanium-tungsten (TiW), which may be referred to as a layer or seed layer. Such layer may, for example be formed by sputtering. Also for example, the UBM structure may comprise a layer of copper (Cu) on the layer of TiW. Such layer may also, for example, be formed by sputtering. Note however, that the UBM structure and/or processes utilized to form the UBM structure are not limited to the examples given. The UBM structure may, for example, comprise any number of conductive layers and/or may be formed by any of a variety of one or more processes.

The first semiconductor die may, for example, comprise a first (or upper) surface comprising the first bond pad and a second (or lower) surface opposite to the first surface, the second semiconductor die may, for example, comprise a first (or upper) surface comprising a second bond pad and a second (or lower) surface opposite to the first surface, and the first surface of the first semiconductor die may be mounted to (e.g., adhered to or otherwise attached to) the second surface of the second semiconductor die.

According to another aspect of the present disclosure, there is provided a semiconductor package (e.g., a sensor package) comprising a first semiconductor die that comprises a first bond pad formed thereon, a second semiconductor die mounted to (e.g., adhered to) the first semiconductor die and comprising a second bond pad formed thereon, a first passivation layer formed on the first and second semiconductor dies and exposing the first and second bond pads to the outside of the first passivation layer, a redistribution layer connecting the first and second bond pads to each other (e.g., bridging the entire gap between the first and second bond pads), and one or more conductive attachment structures (e.g., package attachment structures, conductive bumps, etc.) connected to the redistribution layer.

The redistribution layer may, for example, comprise a first redistribution layer trace connecting the first and second bond pads to each other and a second redistribution layer trace connecting the second bond pad and the conductive attachment structure(s) to each other.

A second dielectric layer (e.g., a passivation layer, an encapsulant layer, etc.) may, for example, be formed on the redistribution layer and the first passivation layer, where the conductive attachment structures are exposed to the outside of the second dielectric layer. An encapsulant layer may, for example, be formed on the second dielectric layer, where the conductive attachment structures are exposed to the outside of the encapsulant layer.

A width of the first semiconductor die may, for example, be greater than a width of the second semiconductor die.

The semiconductor device may, for example, comprise under bump metals between the conductive attachment structures and the redistribution layer.

As described herein, an example implementation of the present disclosure may provide a semiconductor device or package (e.g., a sensor device or sensor package) and manufacturing method thereof, which can reduce the thickness and manufacturing cost of the semiconductor device. For example, according to various aspects of the present disclosure, the first semiconductor die and the second semiconductor die and/or the conductive attachment structures may be connected to each other by a redistribution layer without a loop height (e.g., without a wire loop), thereby reducing the thickness of the sensor package. In addition, since a TSV structure is not necessarily employed, the manufacturing cost of the semiconductor device may be reduced.

Referring to FIGS. 1A through 1G, an example manufacturing method of a semiconductor device or package (e.g., a sensor package or other device) according to various aspects of the present disclosure is illustrated.

As illustrated in FIGS. 1A through 1G, the manufacturing method of a semiconductor device 100 according to various aspects of the present disclosure may comprise preparing a first semiconductor die 110, mounting a second semiconductor die 120, forming a first passivation layer 130, forming a redistribution layer 140, forming a second dielectric layer 150 (e.g., a second passivation layer, an encapsulant layer, etc.), and connecting one or more conductive attachment structures 160. In addition, the manufacturing method of a semiconductor device 100 according to an embodiment of the present invention may further include singulating when a plurality of semiconductor deices 100 are simultaneously assembled on a wafer, a strip or a panel.

As illustrated in FIG. 1A, in the preparing of the first semiconductor die 110, the first semiconductor die 110 is prepared, the first semiconductor die 110 comprising a planar first (e.g., upper) surface 111, a planar second (e.g., lower) surface 112 opposite to the first surface 111, a plurality of side surfaces between the first surface 111 and the second surface 112 (which might not, for example, exist until after singulation of the first semiconductor die 110), and a first bond pad 113 formed on the first surface 111. The first semiconductor die 110 may be, for example, comprise a general semiconductor die and/or a sensor die (e.g., a terrestrial magnetism sensor, a GPS sensor, an inertial sensor, an environment sensor, a chemical sensor, a pressure sensor, a sound sensor, a light sensor, a video sensor, a proximity sensor, and/or equivalents thereof), but aspects of the present disclosure are not limited thereto. The semiconductor die 110 may also, for example, comprise a sensor controller (or processor) die.

Figure 1B:
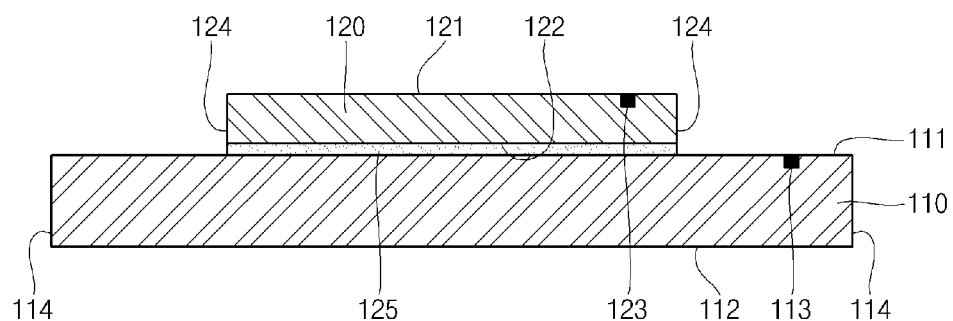

As illustrated in FIG. 1B, in the mounting of the second semiconductor die 120, the second semiconductor die 120 is prepared, the second semiconductor die 120 comprising a planar first (e.g., upper) surface 121, a planar second (e.g., lower) surface 122 opposite to the first surface 121, a plurality of side surfaces between the first surface 121 and second surface 121, and a second bond pad 123 formed on the first surface 121, and the second surface 122 of the second semiconductor die 120 may be mounted to the first surface of the first semiconductor die 110 (e.g., adhesively attached). The second semiconductor die 120 may, for example, comprise a general semiconductor die, a sensor controller (or processor) die, for example for processing a sensing signal received from the first semiconductor die 110, and equivalents thereof, but aspects of the present invention are not limited thereto. The second semiconductor die 120 may also, for example, comprise a sensor die (e.g., a terrestrial magnetism sensor, a GPS sensor, an inertial sensor, an environment sensor, a chemical sensor, a pressure sensor, a sound sensor, a light sensor, a video sensor, a proximity sensor, and/or equivalents thereof), but aspects of the present disclosure are not limited thereto.

The second semiconductor die 120 may be mounted (e.g., directly or indirectly mounted) to the first semiconductor die 110 in any of a variety of manners (e.g., utilizing adhesive paste or tape, utilizing solder, etc.). In an example scenario in which adhesive is utilized, the adhesive 125 may, for example, comprise one or more of: a general epoxy resin, a double-sided adhesive tape and/or equivalents thereof, but aspects of the present disclosure are not limited thereto.

In addition, since the first semiconductor die 110 may be relatively wider than the second semiconductor die 120, opposite ends 114 of the first semiconductor die 110 may extend laterally beyond opposite ends 124 of the second semiconductor die 120 and extend laterally outward a predetermined length. In addition, the first bond pad 113 of the first semiconductor die 110 might not be covered by the second semiconductor die 120, but rather exposed (e.g., laterally beyond the second semiconductor die 120). Accordingly, the example first passivation layer 130, the redistribution layer 140, the second dielectric layer 150 (e.g., second passivation layer) and the conductive structure(s) 160, which will later be described, may be formed on the first surface 111 of the first semiconductor die 110. It should be noted that while only a single second semiconductor die 120 is shown mounted to the first semiconductor die 110, a plurality of such second semiconductor dies 120 may be similarly mounted and/or processed as discussed herein.

Figure 1C:
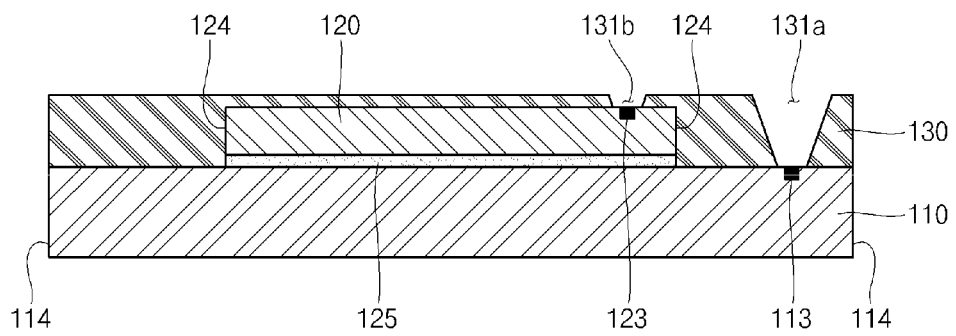

As illustrated in FIG. 1C, in the forming of the first passivation layer 130, the first passivation layer 130 (e.g., having a predetermined thickness) is formed on the first surface 111 of the first semiconductor die 110 and the first surface 121 of the second semiconductor die 120. Here, not only the first surface 121 of the second semiconductor die 120 but also the opposite ends 124 and/or all sides thereof are surrounded by the first passivation layer 130.

The first passivation layer 130 may be formed in any of a variety of manners. For example, the first passivation layer 130 may be formed by one of screen printing, spin coating, spray depositing, and equivalents thereof, but aspects of the present disclosure are not limited thereto.

In addition, apertures (or openings) 131a and 131b each having a predetermined diameter may be formed in the first passivation layer 130 (e.g., by a photolithography process and/or an etching process, etc.), and the apertures 131a and 131b allow the first bond pad 113 of the first semiconductor die 110 and the second bond pad 123 of the second semiconductor die 120 to be exposed to the outside of the first passivation layer 130. For example, the first bond pad 113 may be exposed to the outside through the first opening 131a and the second bond pad 123 may be exposed to the outside through the second opening 131b. In the illustrated example, since a distance from a top surface of the first passivation layer 130 to the first surface 111 of the first semiconductor die 110 is greater than a distance from a top surface of the first passivation layer 130 to the first surface 121 of the second semiconductor die 120, a depth of the first opening 131a is greater than a depth of the second opening 131b. In the example shown, the entire top surface of the first passivation layer 130 (e.g., the portion of the first passivation layer 130 directly above the first semiconductor die 110 and not the second semiconductor die 120, and the portion of the first passivation layer 130 directly above the second semiconductor die 120) may be in a single plane. Alternatively, the first passivation layer 130 may be a constant thickness throughout (e.g., with the top surface of the first passivation layer 130 generally following the contour of the first semiconductor die 110 and the second semiconductor die 120). Alternatively, the first passivation layer 130 may be thicker directly above the first semiconductor die 110 and not the second semiconductor die 120 than the thickness of the first passivation layer 130 directly above the second semiconductor die 120, yet not result in the entire top surface of the first passivation layer 130 being coplanar.

As an example, the first passivation layer 130 may be made of one or more passivation layer materials comprising bismaleimidetriazine (BT), phenolic resin, polyimide (PI), benzo cyclo butene (BCB), poly benz oxazole (PBO), epoxy and equivalents thereof or mixtures thereof, but aspects of the present disclosure are not limited thereto. For example, the first passivation layer 130 may also be made of one or more passivation layer materials comprising silicon oxide, silicon nitride and equivalents thereof. These inorganic layers may, for example, be formed by one or more of chemical vapor deposition (CVD), physical vapor deposition (PVD) and equivalents thereof, but aspects of this disclosure are not limited thereto.

Figure 1D:
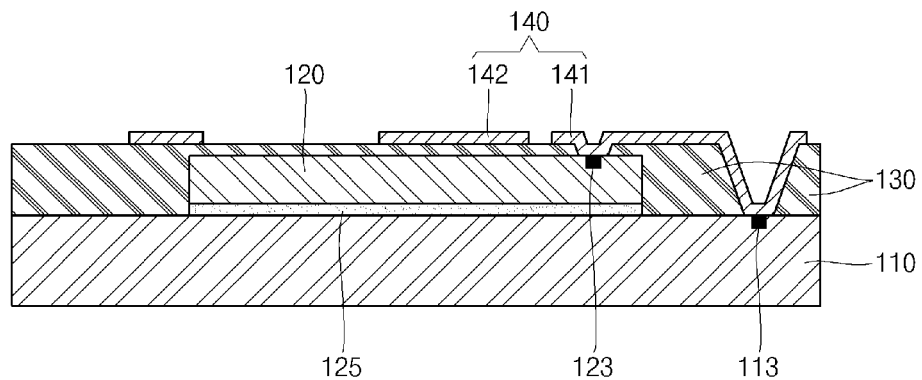

As illustrated in FIG. 1D, in the forming of the redistribution layer 140, the redistribution layer 140 may be formed to electrically connect the first bond pad 113 and the second bond pad 123 to each other. The redistribution layer 140 may, for example, formed on the first passivation layer 130 (e.g., directly on the first passivation layer 130, including the apertures 131a and 131b, on the bond pads 112 and 123, etc.), and the conductive connection structure(s) 160 to be described later may be connected to the redistribution layer 140. For example, the redistribution layer 140 may comprise a first redistribution layer 141 trace connecting the first bond pad 113 and the second bond pad 123 to each other and a second redistribution layer trace 142 connecting the second bond pad 123 and the conductive attachment structure(s)

160 to each other. The first redistribution layer trace 141 and the second redistribution layer trace 142 may thus be connected to each other (see FIG. 1G.).

The redistribution layer 140 may, for example, be formed by forming a seed layer made of tungsten (W) or titanium tungsten (TiW) on the first and second apertures 131a and 131b, including on the first and second bond pads 113 and 123, and on the first passivation layer 130 (e.g., by plating, sputtering, or other deposition process), forming a conductive layer made of copper (Cu) on the seed layer by plating (e.g., relatively thickly compared to the seed layer), and patterning the redistribution layer 140 in a desired manner by a photolithography process and/or an etching process, but aspects of the present invention are not limited by characteristics of any particular material and/or process.

Figure 1E:
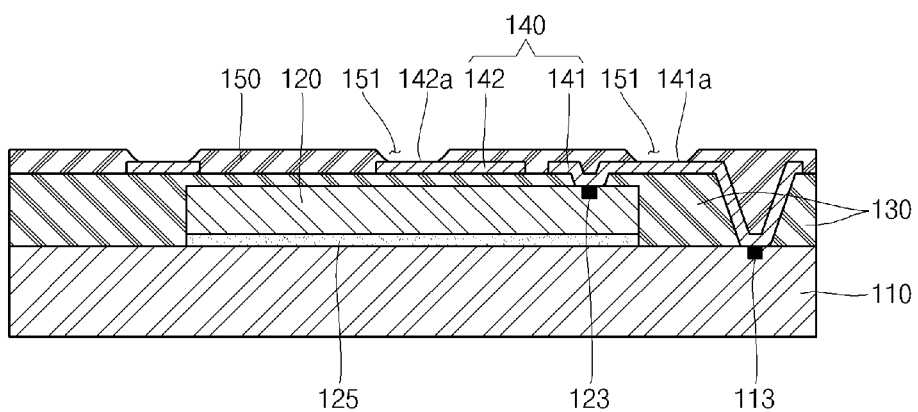

As illustrated in FIG. 1E, in the forming of the dielectric layer 150 (e.g., a second passivation layer, an encapsulation layer, etc.), the dielectric layer 150 is formed on the redistribution layer 140 and the first passivation layer 130 positioned around the redistribution layer 140. In this example, the dielectric layer 150 comprises a second passivation layer, but as will be discussed herein (e.g., with regard to FIGS. 3 and 4), the dielectric layer 150 may comprise an encapsulation layer. Accordingly, for this example, the dielectric layer 150 may also be referred to herein in a non-limiting manner as the second passivation layer 150. Note that the redistribution layer 140 and the dielectric layer 150 may be referred to as a "signal distribution structure (SDS)" (e.g., a "bottom side signal distribution structure (BSDS)" or a "top side signal distribution structure (TSDS)" depending on orientation context).

As described herein with regard to the first passivation layer 130, the second passivation layer 150 may be formed by one of screen printing, spin coating, spray depositing, and equivalents thereof, but aspects of the present disclosure are not limited thereto.

For example, apertures (or openings) 151 each having a predetermined diameter may be formed in the second passivation layer 150 (e.g., by a photolithography process and/or an etching process, etc.), and the apertures 151 allow land regions 141a and 142a of the redistribution layer 140, which will be connected to the conductive structures 160, to be exposed to the outside of the second passivation layer 150.

As with the first passivation layer 130, the second passivation layer 150 may be made of one or more passivation layer materials comprising bismaleimidetriazine (BT), phenolic resin, polyimide (PI), benzo cyclo butene (BCB), poly benz oxazole (PBO), epoxy and equivalents thereof or mixtures thereof, but aspects of the present disclosure are not limited thereto. For example, the second passivation layer 150 may also be made of one or more passivation layer materials comprising silicon oxide, silicon nitride and equivalents thereof. These inorganic layers may, for example, be formed by one of chemical vapor deposition (CVD), physical vapor deposition (PVD) and equivalents thereof, but aspects of this disclosure are not limited thereto. In an example implementation, the first passivation layer 130 and the second passivation layer 150 may be formed using different respective processes.

Note that the second passivation layer 150 is illustrated as being thinner than the first passivation layer 130, but this need not be the case. For example, the second passivation layer 150 may be as thick as, or thicker than, the first passivation layer 130.

Also note that although only one conductive layer of the redistribution layer 140 is illustrated, a plurality of such conductive layers may be formed in alternating fashion with dielectric layers (e.g., in a multi-layer redistribution layer configuration).

Figure 1F:
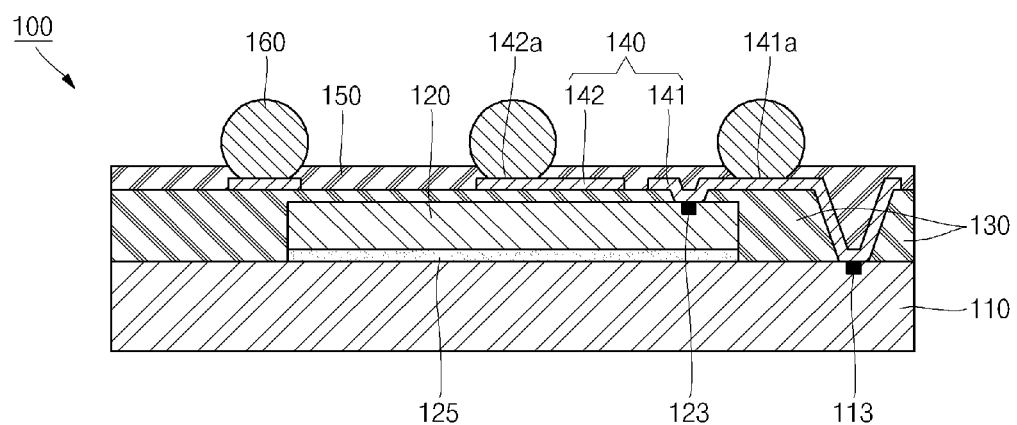
Figure 1G:
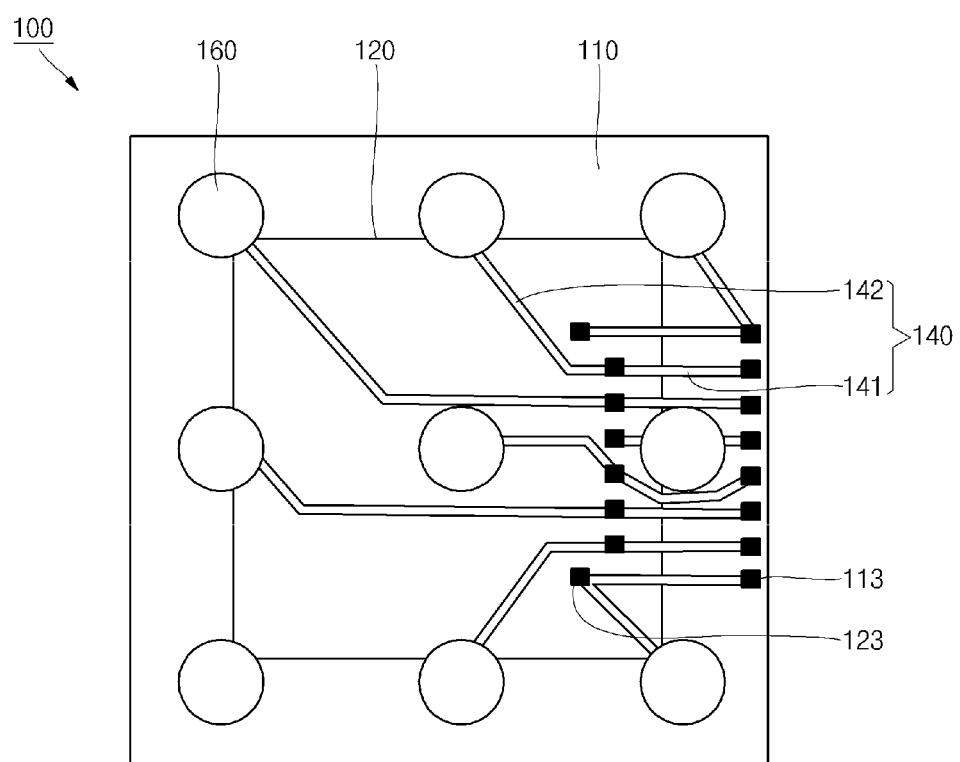

As illustrated in FIGS. 1F and 1G, in the connecting of the conductive attachment (or connection) structures 160 (which may also be referred to herein generally as "conductive structures 160"), the conductive structures 160 are connected to the redistribution layer 140 exposed to the outside of the second passivation layer 150 through the openings 151 of the second passivation layer 150, for example, to the land regions 141a and 142a, thereby making the conductive structures 160 protrude to the outside of the second passivation layer 150. The conductive structures 160 may comprise one or more of any of a variety of conductive structures utilized for interconnection between semiconductor devices or packages. For example, the connection structures 160 may comprise conductive bumps or balls, conductive pillars (e.g., copper pillars) or wires, pastes, adhesives, etc.

For example, the conductive structures 160 may be connected in the following manner. After a volatile flux is coated on the land regions 141a and 142a, the conductive structures (e.g., bumps) 160 in solid phases may be temporarily connected on the flux. Thereafter, a reflow temperature of approximately 150° C. to 250° C. is supplied, thereby volatilizing the flux for removal, and melting the conductive structures 160 to then be directly connected to the land regions 141a and 142a. Here, the conductive structures 160 become substantially spherical by surface tension and are then solidified by cooling. In another example, the conductive structures 160 may be plated, printed, or otherwise deposited.

The conductive structures 160 may, for example, be made of one or more materials comprising a eutectic solder ($Sn_{37}Pb$), a high lead solder ($Sn_{95}Pb$), a lead-free solder (SnAg, SnAu, SnCu, SnZn, SnZnBi, SnAgCu, SnAgBi, etc.) and equivalents thereof, but aspects of the present invention are not limited thereto. The conductive structures 160 may, for example, be made of one or more material comprising plated metal (e.g., Cu, Au, Si, etc.), plated solder, etc.

As described here, according to various aspects of the present disclosure, a plurality of semiconductor devices or packages 100 (e.g., sensor packages 100) may be simultaneously or concurrently manufactured in forms of wafers, strips or panels. In this case, after the connecting of the conductive attachment structures 160, the manufacturing method of the present invention may further include singulation of the individual devices or packages. Such singulation may, for example, be performed by sawing with a blade (e.g., with a diamond blade), punching, cutting with a laser beam or other energy beam, etc., but aspects of the present disclosure are not limited thereto.

In the singulating, the singulating may be performed sequentially on the first semiconductor die 110, the first passivation layer 130 and the second passivation layer 150 in that order, or sequentially on the second passivation layer 150, the first passivation layer 130 and the first semiconductor die 110 in that order. In such a manner, opposite ends of each of the first semiconductor die 110, the first passivation layer 130 and the second passivation layer 150 become coplanar. Also for example, the singulating of all layers may be performed substantially simultaneously. In an example implementation, for example following such singulation, the side surfaces (or end surfaces) of the first semiconductor die 110 may be exposed. Such exposed surfaces may be left as-is or may be subsequently covered with a protective coating.

As shown in FIG. 1G, first and second bond pads of the first and second semiconductor dies, respectively, may be located toward a single side of their respective dies. Alternatively, such bond pads may be dispersed around the entire perimeters of the dies or portions of the entire perimeters. Also, though the second semiconductor die 120 is generally illustrated as being centered on the first semiconductor die 110, this disclosure is not limited to such a configuration. For example, the second semiconductor die 120 may be located off-center on the first semiconductor die 110.

As described above, in one example implementation, the semiconductor device or package 100 having reduced thickness and manufacturing cost and the manufacturing method thereof are provided. That is to say, according to various aspects of the present disclosure, since the first semiconductor die 110 and the second semiconductor die 120 and/or the conductive structures 160 are connected to each other by the redistribution layer 140 without a loop height, the thickness of the semiconductor device 100 can be reduced. In addition, since a TSV structure is not necessarily employed, the manufacturing cost of the semiconductor device 100 can be reduced.

Hereinafter, other example implementations of the present disclosure will be described with regard to other respective configurations of the semiconductor device 100. It should be noted that any of the example implementations discussed herein may share any one or more characteristics with any one or more of the other example implementations discussed herein.

Figure 2:
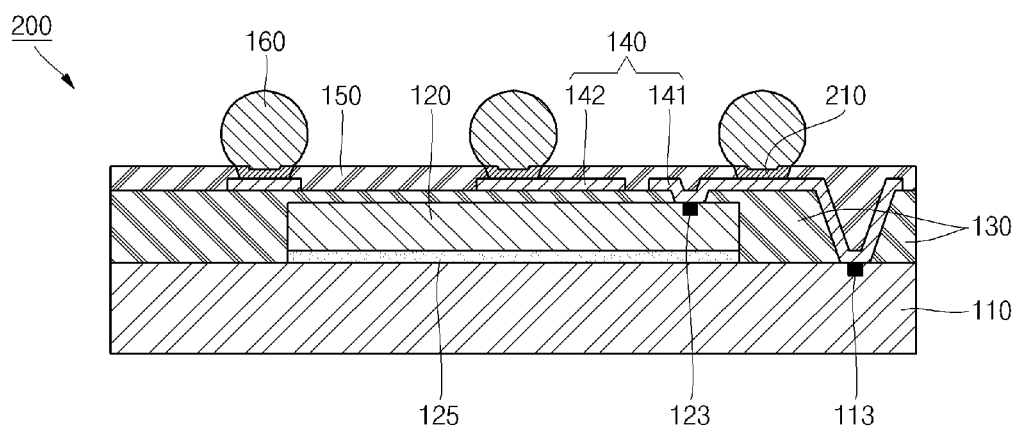
FIG. 2 is a cross-sectional view illustrating an example semiconductor device, in accordance with various aspects of the present disclosure.

Referring to FIG. 2, a cross-sectional view of an example semiconductor device 200 in accordance with various aspects of the present disclosure is illustrated. The semiconductor device (or package) 200 may, for example, share any or all characteristics with any of the other example semiconductor devices 100, 300, 400, 500, and 600 discussed herein.

As illustrated in FIG. 2, under bump metals 210, for example, may be formed on a redistribution layer 140, thereby electrically connecting conductive attachment structures 160 to the redistribution layer 140 in a more secure manner. For example, in an example implementation, no intermetallic compound is formed between the conductive attachment structures 160 and the redistribution layer 140 by the under bump metals 210, thereby reducing contact resistance between the conductive structures 160 and the redistribution layer 140 and ultimately improving connection reliability therebetween.

The under bump metals 210 may comprise, for example, a palladium (Pd) layer plated on the redistribution layer 140, a nickel (Ni) layer plated on the Pd layer, and a gold (Au) or silver (Ag) layer plated on the Ni layer. However, the present invention does not limit the kinds of the under bump metals 210 to those listed herein. Various kinds of under bump metals other than those listed herein may be provided.

Even if, for example, the under bump metals 210 are not provided, an anti-oxidation layer, such as a gold (Au) or silver (Ag) layer, may be formed on a surface (i.e., land regions) of the redistribution layer 140 connected to the conductive attachment structures 160.

Figure 3:
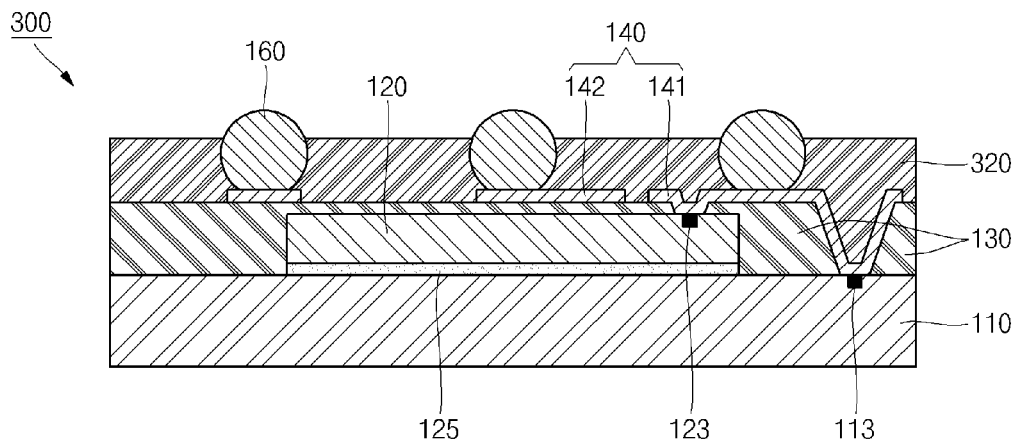
FIG. 3 is a cross-sectional view illustrating another example semiconductor device, in accordance with various aspects of the present disclosure.

Referring to FIG. 3, a cross-sectional view of an example semiconductor device 300 in accordance with various aspects of the present disclosure is illustrated. The semiconductor device (or package) 300 may, for example, share any or all characteristics with any of the other example semiconductor devices 100, 200, 400, 500, and 600 discussed herein.

As illustrated in FIG. 3, a dielectric layer 320 comprising an encapsulant layer 320 (e.g., instead of a second passivation layer 150 as formed in the example semiconductor device 100 of FIG. 1), may be formed on a redistribution layer 140 and a first passivation layer 130. The example encapsulant layer 320 is formed to approximately ¼ to ¾ the overall height of the conductive structures 160, thereby tightly fixing the peripheral regions of the conductive structures 160 by the encapsulant layer 320. Therefore, the connection reliability between the conductive structures 160 and the redistribution layer 140 may be improved. With this configuration, the conductive structures 160 are exposed to the outside of the encapsulant layer 320.

The encapsulant layer 320 may, for example, be formed by a general transfer molding process using a mold, a dispensing process using a dispenser, or the like. In addition, the encapsulant layer 320 may be made of an epoxy molding compound including a filler, an epoxy resin, a hardener and a flame retardant, and equivalents thereof, but aspects of the present invention are not limited thereto.

Figure 4:
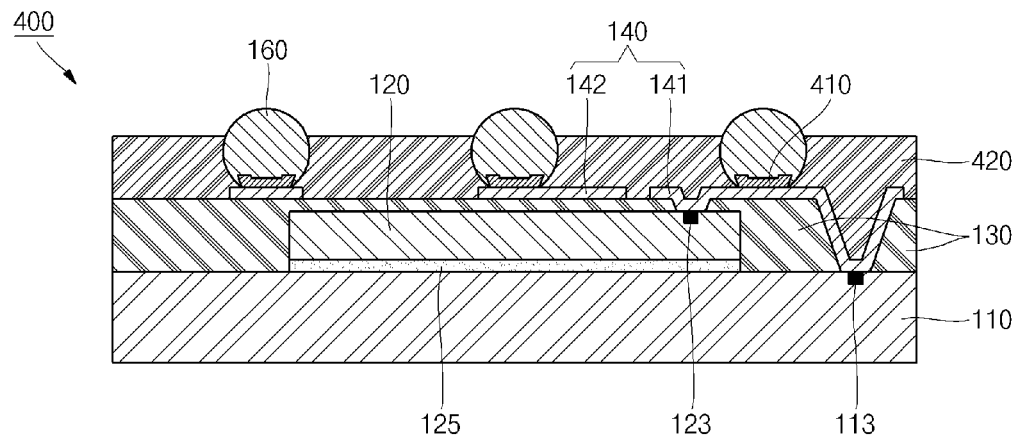
FIG. 4 is a cross-sectional view illustrating an additional example semiconductor device, in accordance with various aspects of the present disclosure.

Referring to FIG. 4, a cross-sectional view of an example semiconductor device 400 in accordance with various aspects of the present disclosure is illustrated. The semiconductor device (or package) 400 may, for example, share any or all characteristics with any of the other example semiconductor devices 100, 200, 300, 500, and 600 discussed herein.

As illustrated in FIG. 4, under bump metals 410, for example, may be formed on a redistribution layer 140, thereby connecting conductive attachment structures 160 to the redistribution layer 140 via the under bump metals 410. Such under bump metallization is discussed herein, for example in the discussion of FIG. 2. In addition, a dielectric layer 420 comprising an encapsulant layer 420 may be formed on the redistribution layer 140 and a first passivation layer 130. Such an encapsulant layer 420 is discussed herein, for example in the discussion of FIG. 3. The encapsulant layer 420 may, for example, be formed to ¼ to ¾ the overall height of the conductive structures 160.

Accordingly, the under bump metals 410 may improve connection reliability between the conductive structures 160 and the redistribution layer 140. In addition, the encapsulant layer 420 may improve coupling forces between the conductive structures 160 and the encapsulant layer 420.

Figure 5:
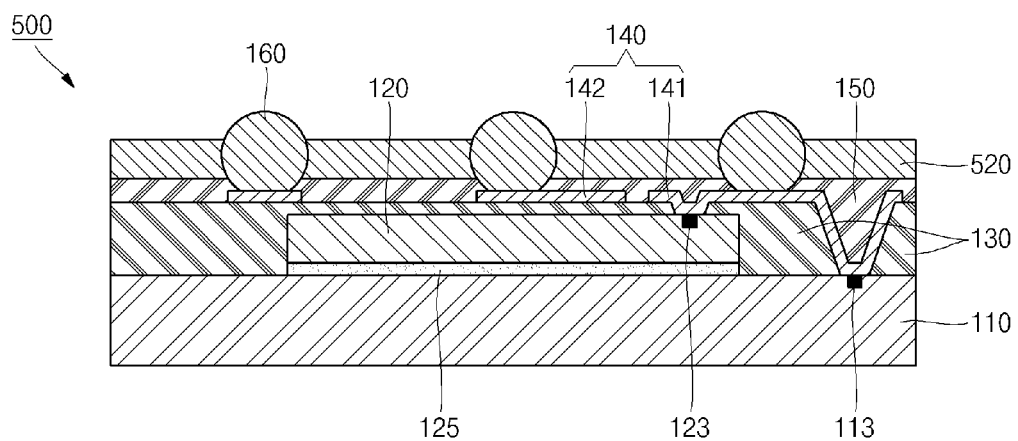
FIG. 5 is a cross-sectional view illustrating a further example semiconductor device, in accordance with various aspects of the present disclosure.

Referring to FIG. 5, a cross-sectional view of an example semiconductor device 500 in accordance with various aspects of the present disclosure is illustrated. The semiconductor device (or package) 500 may, for example, share any or all characteristics with any of the other example semiconductor devices 100, 200, 300, 400, and 600 discussed herein.

As illustrated in FIG. 5, for example in addition to the structure shown in FIG. 1F and discussed herein, an encapsulant layer 520 may further be formed on a second passivation layer 150. An example of encapsulant layer formation was presented in the discussion of FIG. 3. The encapsulant layer 520 may, for example, be formed to approximately ¼ to ¾ the overall height of conductive structures 160, thereby tightly fixing the peripheral regions of the conductive structures 160 by the encapsulant layer 520. Therefore, the connection reliability between the conductive structures 160 and the redistribution layer 140 can be improved.

Figure 6:
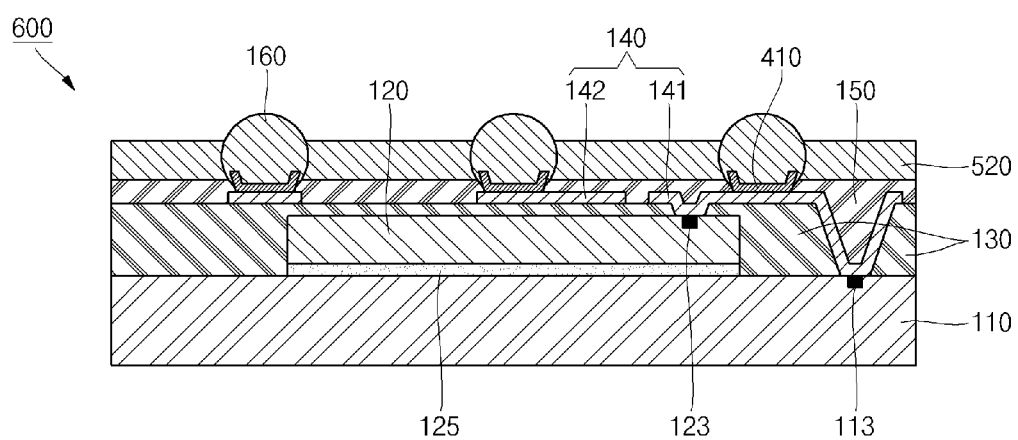
FIG. 6 is a cross-sectional view illustrating yet another example semiconductor device, in accordance with various aspects of the present disclosure.

Referring to FIG. 6, a cross-sectional view of an example semiconductor device 600 in accordance with various aspects of the present disclosure is illustrated. The semiconductor device (or package) 600 may, for example, share any or all characteristics with any of the other example semiconductor devices 100, 200, 300, 400, and 500 discussed herein As illustrated in FIG. 6, under bump metals 410, for example, may be formed on a redistribution layer 140, thereby electrically connecting conductive structures 160 to the redistribution layer 140 in a more secure manner. For example, in an example implementation, no intermetallic compound is formed between the conductive structures 160 and the redistribution layer 140 by the under bump metals 410, thereby reducing contact resistance between the conductive structures 160 and the redistribution layer 140 and ultimately improving connection reliability therebetween. Such under bump metallization is discussed herein, for example in the discussion of FIG. 2.

The under bump metals 410 may include, for example, a palladium (Pd) layer plated on the redistribution layer 140, a nickel (Ni) layer plated on the Pd layer, and a gold (Au) or silver (Ag) layer plated on the Ni layer. However, the present invention does not limit the kinds of the under bump metals 410 to those listed herein. Various kinds of under bump metals other than those listed herein may be provided.

Even if, for example, the under bump metals 410 are not provided, an anti-oxidation layer, such as a gold (Au) or silver (Ag) layer, may be formed on a surface (i.e., land regions) of the redistribution layer 140 connected to the conductive structures 160.

In summary, various aspects of this disclosure provide a semiconductor device or package structure and a method for manufacturing thereof. While the foregoing has been described with reference to certain aspects and embodiments, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular embodiment(s) disclosed, but that the disclosure will include all embodiments falling within the scope of the appended claims.

What is claimed is:

1. A semiconductor package comprising:
    a bottom side signal distribution structure (BSDS) comprising a first lower dielectric layer and a first lower conductive layer, the bottom side signal distribution structure having a top BSDS side and a bottom BSDS side;
    a semiconductor die comprising a top die side, and a bottom die side coupled to the top BSDS side, wherein the bottom die side comprises a die bond pad coupled to the first lower conductive layer;
    a package attachment structure coupled to the bottom BSDS side and electrically coupled to die bond pad via the first lower conductive layer;
    a layer of an encapsulating material that at least laterally surrounds the semiconductor die and covers the top BSDS side;
    a conductive through via that runs vertically entirely through the encapsulating material and is electrically connected to the die bond pad via the first lower conductive layer; and
    a layer of adhesive material that covers at least the top die side,
    wherein a top end of the conductive through via and a top side of the layer of adhesive material are at a same height above the bottom side signal distribution structure.

2. The semiconductor package of claim 1, wherein:
    the layer of the encapsulating material covers the bottom die side and comprises a first aperture; and
    the first lower conductive layer is coupled to the die bond pad through the first aperture.

3. The semiconductor package of claim 1, wherein the layer of the encapsulating material laterally surrounds the layer of adhesive material, and a top side of the layer of the encapsulating material is substantially coplanar with the top side of the layer of adhesive material.

4. The semiconductor package of claim 1, wherein the conductive through via comprises a single continuous metal material that extends entirely between an uppermost side of the encapsulating material and a lowermost side of the encapsulating material.

5. The semiconductor package of claim 1, wherein the top end of the conductive through via is coplanar with a top side of the encapsulating material.

6. The semiconductor package of claim 1, wherein the conductive through via comprises a sloped sidewall.

7. The semiconductor package of claim 1, comprising a top side signal distribution structure, wherein the top end of the conductive through via is directly connected to the top side signal distribution structure in a solderless connection.

8. The semiconductor package of claim 7, wherein the top side signal distribution structure comprises a signal distribution structure of an upper semiconductor die.

9. The semiconductor package of claim 8, wherein the signal distribution structure of the upper semiconductor die comprises a bond pad of the upper semiconductor die.

10. The semiconductor package of claim 1, wherein the top end of the conductive through via is configured for direct attachment to a die.

11. A semiconductor package comprising:
    a signal distribution structure (SDS) having a top SDS side and a bottom SDS side, where the signal distribution structure comprises a first SDS dielectric layer and a first SDS conductive layer;
    a semiconductor die comprising a top die side, a bottom die side coupled to the top SDS side, and a die bond pad on the bottom die side and coupled to the first SDS conductive layer;
    a package attachment structure for connecting the semiconductor package to another component, where the package attachment structure is coupled to the bottom SDS side and electrically coupled to the die bond pad via the first SDS conductive layer; and
    a dielectric layer comprising a single layer of material, wherein the single layer of material laterally surrounds the semiconductor die and comprises:
        a top material surface;
        a bottom material surface that covers at least the top SDS side and the bottom die side; and
        a first material aperture that extends from the bottom material surface toward the die bond pad,
    wherein the first SDS conductive layer is coupled to the die bond pad through the first material aperture, and
    wherein a top side of the semiconductor package is free of conductive material.

12. The semiconductor package of claim 11, comprising a layer of adhesive material that covers at least the top die side, and the top die side is not covered by the single layer of material.

13. The semiconductor package of claim 12, wherein a top side of the adhesive material is coplanar with the top material surface of the single layer of material.

14. A semiconductor package comprising:
   a signal distribution structure (SDS) having a top SDS side and a bottom SDS side, where the signal distribution structure comprises a first SDS dielectric layer and a first SDS conductive layer;
   a semiconductor die comprising a top die side, a bottom die side coupled to the top SDS side, and a die bond pad on the bottom die side and coupled to the first SDS conductive layer;
   a package attachment structure for connecting the semiconductor package to another component, where the package attachment structure is coupled to the bottom SDS side and electrically coupled to the die bond pad via the first SDS conductive layer; and
   a dielectric layer comprising a single layer of material, wherein the single layer of material laterally surrounds the semiconductor die and comprises:
      a top material surface;
      a bottom material surface that covers at least the top SDS side and the bottom die side; and
      a first material aperture that extends from the bottom material surface toward the die bond pad,
   wherein:
      the first SDS conductive layer is coupled to the die bond pad through the first material aperture;
      the single layer of material comprises a second material aperture that extends from the bottom material surface to the top material surface; and
      the semiconductor package comprises a conductive through material via that extends entirely through the second material aperture and is electrically connected to the die bond pad.

15. The semiconductor package of claim 14, comprising a top side signal distribution structure comprising a first top conductive layer directly connected to the conductive through material via.

16. The semiconductor package of claim 15, wherein the first top conductive layer is directly connected to the conductive through material via in a direct metal-to-metal solderless connection.

17. The semiconductor package of claim 15, wherein the first top conductive layer comprises a connection pad of a second semiconductor die.

18. A method of making a semiconductor package comprising:
   providing a signal distribution structure (SDS) having a top SDS side and a bottom SDS side, where the signal distribution structure comprises a first SDS dielectric layer and a first SDS conductive layer;
   providing a semiconductor die comprising a top die side, a bottom die side coupled to the top SDS side, and a die bond pad on the bottom die side and coupled to the first SDS conductive layer;
   providing a package attachment structure for connecting the semiconductor package to another component, where the package attachment structure is coupled to the bottom SDS side and electrically coupled to die bond pad via the first SDS conductive layer; and
   providing a dielectric layer comprising a single layer of material, wherein the single layer of material laterally surrounds the semiconductor die and comprises:
      a top material surface;
      a bottom material surface that covers at least the top SDS side and the bottom die side; and
      a first material aperture that extends from the bottom material surface to the die bond pad,
   wherein:
      the first SDS conductive layer is coupled to the die bond pad through the first material aperture;
      the single layer of material comprises a second material aperture that extends from the bottom material surface to the top material surface; and
      the semiconductor package comprises a conductive through material via that extends entirely through the second material aperture and is electrically connected to the die bond pad.

19. The method of claim 18, comprising providing a top side signal distribution structure comprising a first top conductive layer directly connected to the conductive through material via.

20. The method of claim 18, comprising providing a top side signal distribution structure comprising a first top conductive layer directly connected to the conductive through material via in a direct metal-to-metal solderless connection.

* * * * *